United States Patent
Enenkel

(10) Patent No.: US 9,575,106 B2
(45) Date of Patent: Feb. 21, 2017

(54) SYSTEM AND METHOD FOR EVALUATING A MODULE

(75) Inventor: Jan Enenkel, Gratkorn (AT)

(73) Assignee: AMS AG, Unterpremstaetten (AT)

(*) Notice: Subject to any disclaimer, the term of this patent is extended or adjusted under 35 U.S.C. 154(b) by 365 days.

(21) Appl. No.: 14/127,162

(22) PCT Filed: Jun. 12, 2012

(86) PCT No.: PCT/EP2012/061090
§ 371 (c)(1),
(2), (4) Date: Mar. 19, 2014

(87) PCT Pub. No.: WO2012/175370
PCT Pub. Date: Dec. 27, 2012

(65) Prior Publication Data
US 2014/0197852 A1    Jul. 17, 2014

(30) Foreign Application Priority Data
Jun. 21, 2011 (DE) .......... 10 2011 105 076

(51) Int. Cl.
G01R 27/26 (2006.01)
H03K 17/96 (2006.01)
H01H 3/02 (2006.01)

(52) U.S. Cl.
CPC ......... G01R 27/2605 (2013.01); H03K 17/962 (2013.01); *H01H 2003/0293* (2013.01);
(Continued)

(58) Field of Classification Search
None
See application file for complete search history.

(56) References Cited

U.S. PATENT DOCUMENTS 8,264,463 B2 * 9/2012 Takashima ............ G06F 3/0224
345/169
8,743,060 B2 * 6/2014 Hotelling ............. G06F 3/0362
345/156

(Continued)

FOREIGN PATENT DOCUMENTS

DE  202005015210 U1  3/2006
DE  102005025021 A1  12/2006

(Continued)

*Primary Examiner* — Melissa Koval
*Assistant Examiner* — Felicia Farrow
(74) *Attorney, Agent, or Firm* — McDermott Will & Emery LLP

(57) ABSTRACT

In one embodiment, a system comprises a circuit arrangement and a module having a first mechanical switch and an electrode. The circuit arrangement has a terminal that is connected to the module, a drive unit that is connected to the terminal and serves to provide a drive signal, a first evaluation unit that is connected to the terminal and serves for key detection, as well as a second evaluation unit that is connected to the first evaluation unit and serves for proximity detection. Therein the drive signal is designed for driving an electrode of a capacitive proximity sensor in the module, the first evaluation unit is designed to provide a touch signal according to an actuation of the module by a person, and the second evaluation unit is designed to provide a proximity signal according to an approach of a person to the module.

13 Claims, 4 Drawing Sheets

Figure 7:
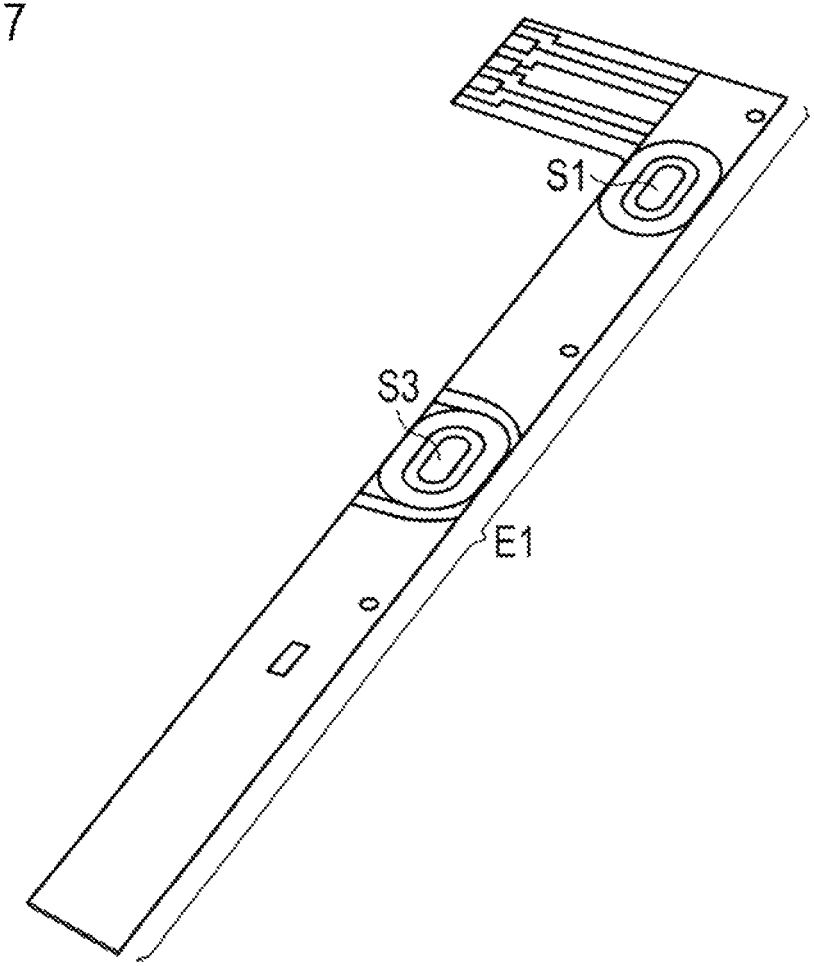

(52) U.S. Cl.
CPC ............... *H01H 2239/006* (2013.01); *H03K 2217/960775* (2013.01)

(56) References Cited

U.S. PATENT DOCUMENTS

| | | | | |
|---|---|---|---|---|
| 2007/0063987 | A1* | 3/2007 | Sato | G06F 3/03547 345/173 |
| 2008/0007533 | A1 | 1/2008 | Hotelling | |
| 2010/0200309 | A1* | 8/2010 | Yilmaz | G06F 3/016 178/18.03 |
| 2010/0295559 | A1* | 11/2010 | Osoinach | H03K 17/9622 324/658 |
| 2013/0278277 | A1* | 10/2013 | Trattler | H03K 17/955 324/679 |

FOREIGN PATENT DOCUMENTS

| | | |
|---|---|---|
| DE | 102006035837 A1 | 2/2008 |
| DE | 102007029322 A1 | 2/2009 |
| WO | 2010/049577 A1 | 5/2010 |

\* cited by examiner

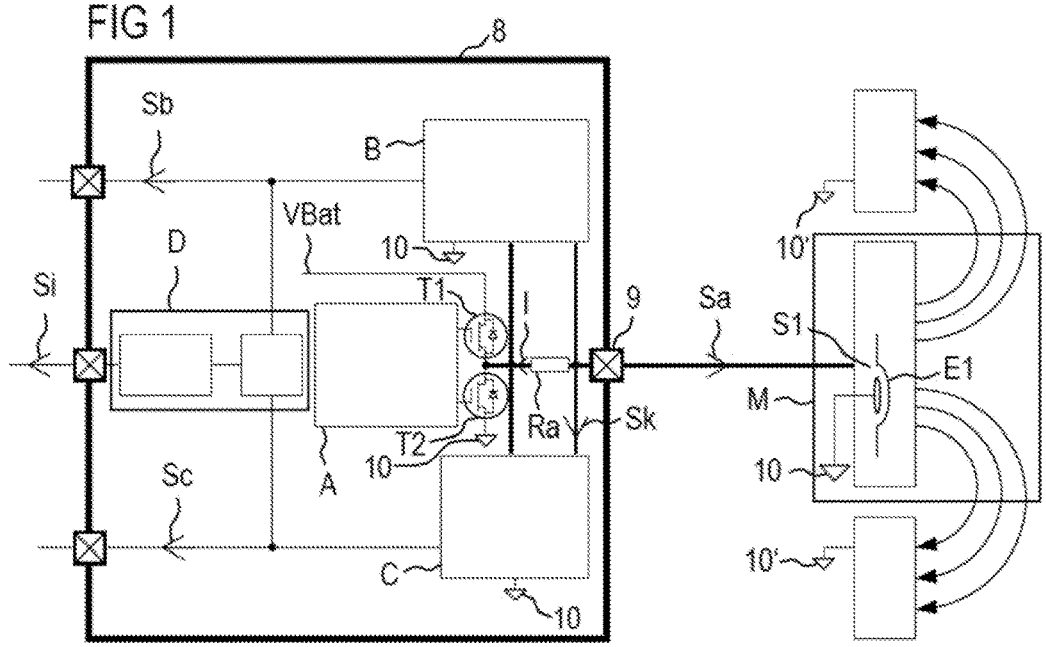
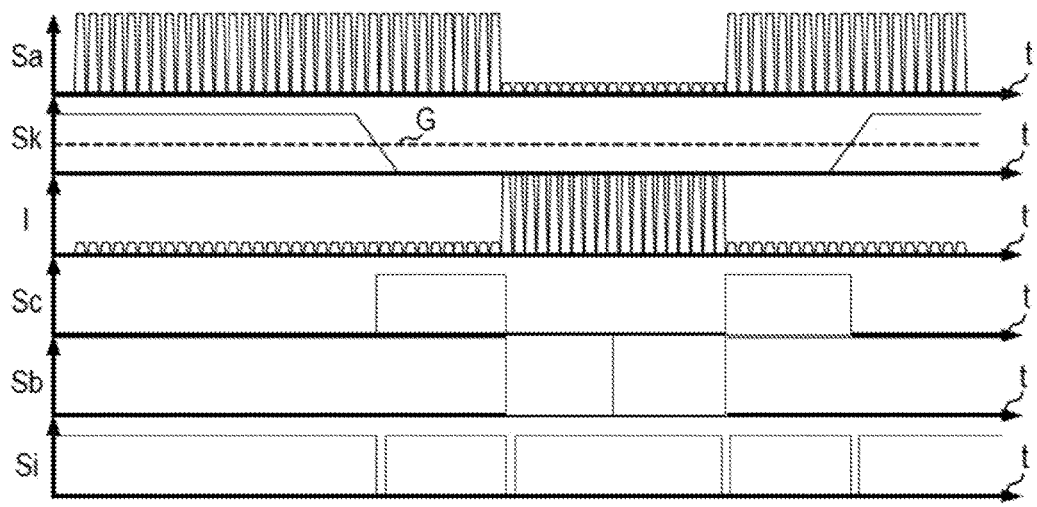

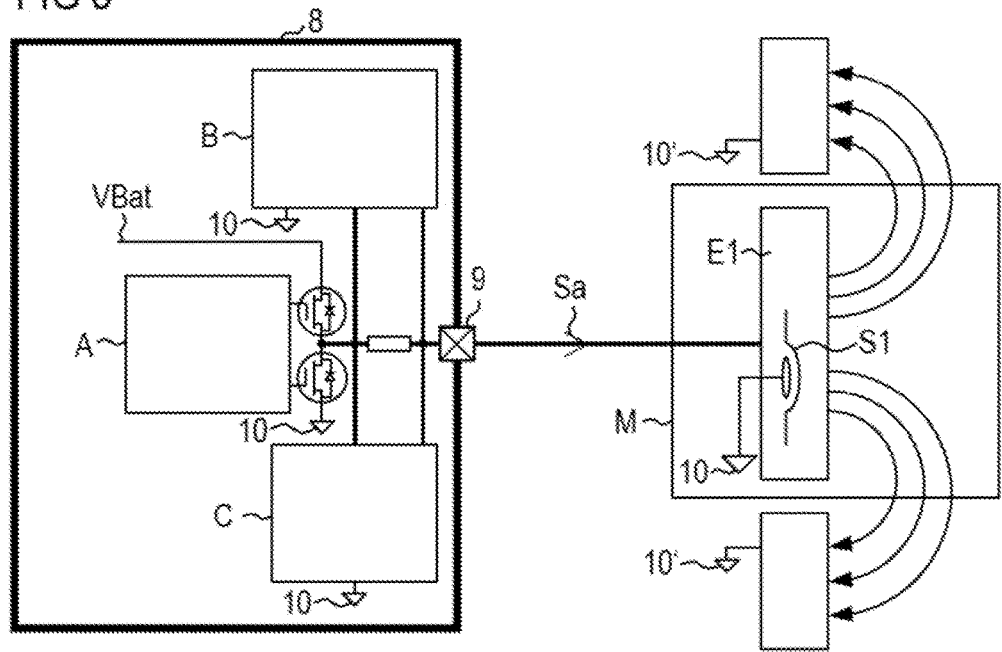
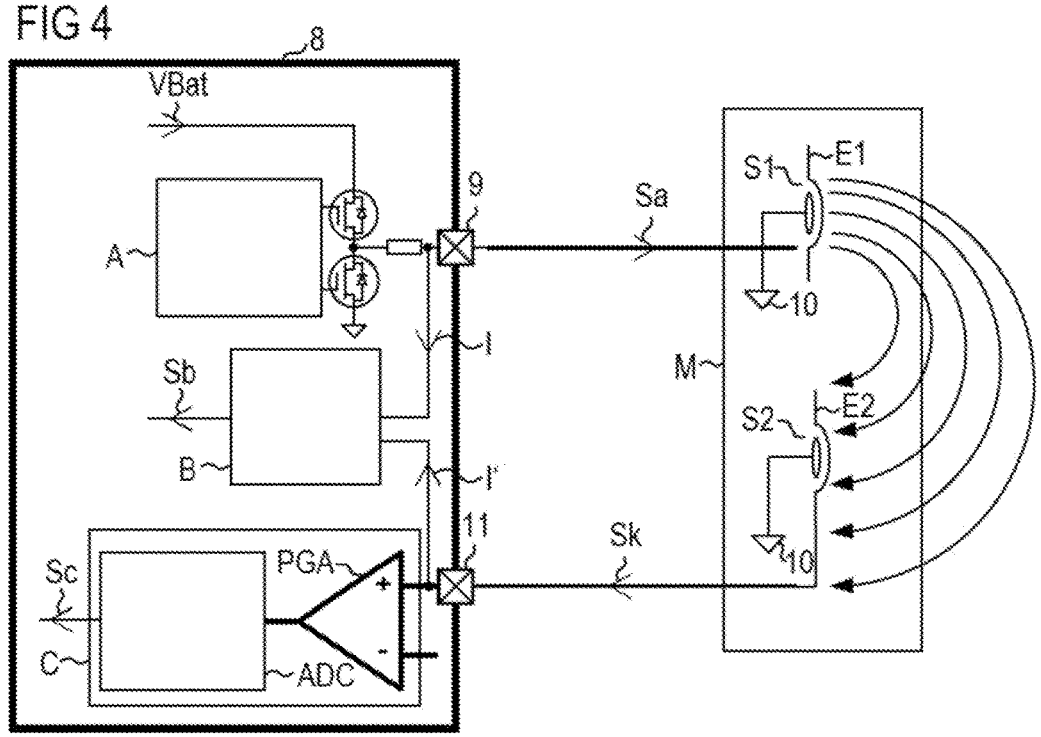

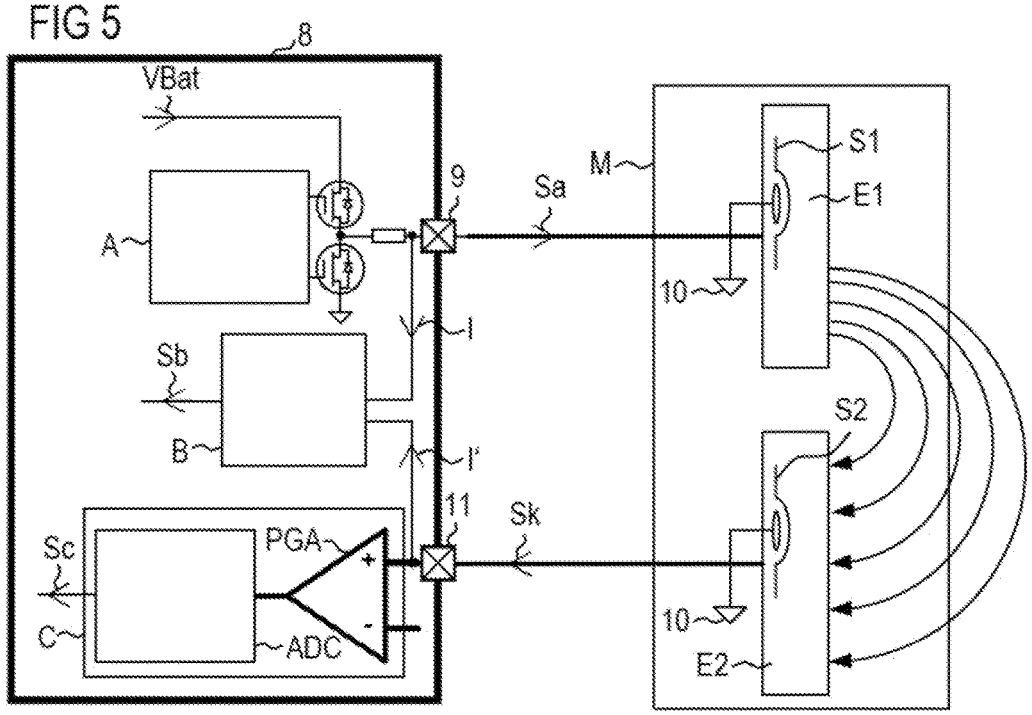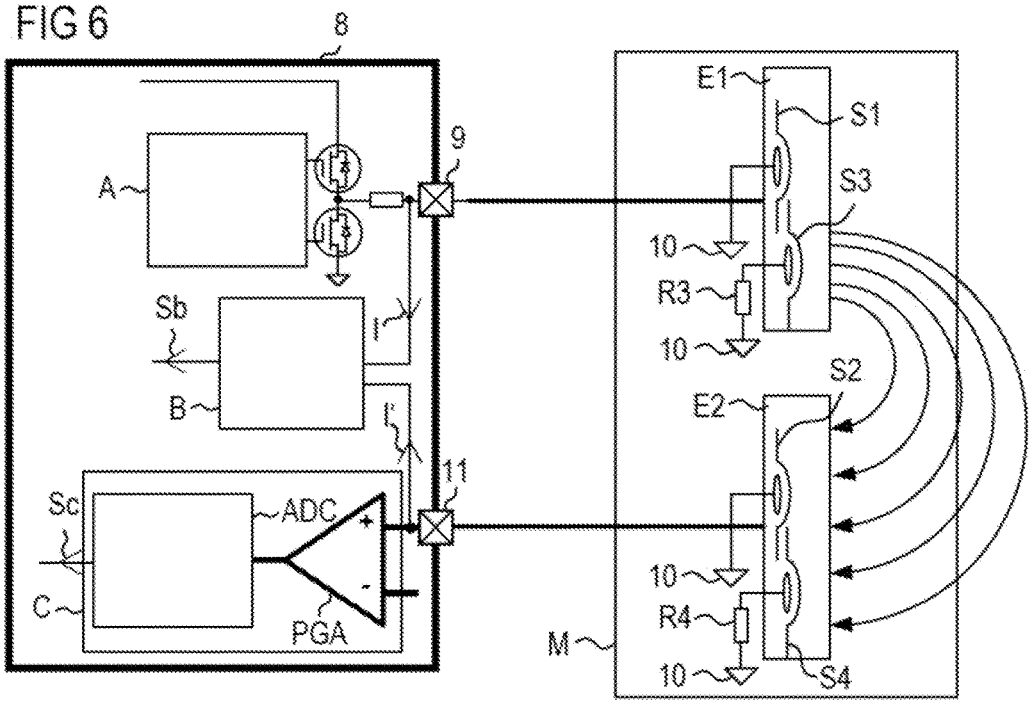

SYSTEM AND METHOD FOR EVALUATING A MODULE

The invention pertains to a system and a method for evaluating a module with a first mechanical switch and an electrode.

In electronic devices such as, for example, mobile telephones, cordless telephones, Personal Digital Assistants or PDAs and the like that are also referred to as terminal equipment, there is an increasing demand for smaller and smaller devices. Due to the miniaturization of the devices, the space available for operating elements such as different buttons or keys is very limited. This also applies to proximity sensors such as, for example, capacitive proximity sensors that in the meantime are also implemented as operating elements in terminal equipment of this type. The electrodes needed for these sensors require additional space on the outside of the devices, wherein this runs contrary to the development of smaller and smaller devices.

It therefore is an objective to provide a space-saving solution for the implementation of a proximity sensor, for example, a capacitive proximity sensor.

This objective is attained with the objects of the independent claims. Enhancements and embodiments form the respective objects of the dependent claims.

In one embodiment, a system has a circuit arrangement and a module with a first mechanical switch and an electrode. The circuit arrangement has a terminal that is connected to the module, a drive unit, as well as a first and a second evaluation unit. The drive unit and the first evaluation unit are respectively connected to the terminal. The drive unit is designed for providing a drive signal. The first evaluation unit is designed for key detection. The second evaluation unit is connected to the first evaluation unit and designed for proximity detection. The drive signal is designed for driving an electrode of the module as an electrode of a capacitive proximity sensor. The first evaluation unit is designed to provide a touch signal according to an actuation of the module by a person. The second evaluation unit is designed to provide a proximity signal according to an approach of a person to the module. A contact of the first switch of the module is electrically connected to the electrode of the module. Furthermore, the capacitive proximity sensor of the module is realized in the form of the contact of the first switch.

The module is controlled by the drive unit by means of the drive signal. The drive unit operates the electrode of the module in order to function as the electrode of a capacitive proximity sensor. The actuation of the module by a person is detected by the first evaluation unit and reflected in the form of the touch signal. The approach of a person to the module is detected by the second evaluation unit and reflected by means of the proximity signal.

The module combines the mechanical switch and the electrode. The combined module can be reliably evaluated with the described circuit arrangement due to the separate evaluation units for proximity detection and key detection. This allows a space-saving solution for the implementation of a proximity sensor.

In addition, it is advantageously possible to combine an electrode of a proximity sensor that already exists in the terminal equipment with, for example, a mechanical switch such that additional space on the outside of the device is not required for this purpose. In this case, the switch and the electrode of the module are mechanically connected to one another, bonded for example. One contact of the switch is electrically connected to the electrode.

In another embodiment, the circuit arrangement features an interrupt generator that is designed to provide an interrupt signal according to the proximity signal and/or the touch signal.

The interrupt generator generates the interrupt signal, the pulses of which indicate the approach of a person to the module and/or the actuation of the module by a person.

A master circuit therefore can react accordingly to these interrupt pulses.

In an enhancement, the circuit arrangement has an additional terminal which is designed to be connected to the module. In this embodiment, the second evaluation unit is also connected to the additional terminal.

The proximity detection takes place according to a signal at the additional terminal of the circuit arrangement.

Due to the fact that the module comprises the mechanical switch and the electrode and is operated and evaluated by the circuit arrangement as described above, advantageously, no additional space is required on the outside of a device.

In an enhancement, the contact of the first switch forms the electrode.

In this particularly space-saving embodiment, the one contact of the first switch is utilized as electrode of the proximity sensor and accordingly driven with the drive signal.

In an alternative embodiment, the first switch is implemented within the electrode.

In this embodiment, the switch and the electrode are arranged in such a way that the mechanical switch is attached, for example, adhesively affixed, in the region of the electrode.

This advantageously makes it possible to save the space that would otherwise be required for an additional mechanical switch, and to leave this space open for other functions.

In an enhancement, the proximity signal is provided according to a change of a value of a ground capacitance between the module and a reference potential terminal.

In this embodiment, the module is realized in the form of a proximity sensor according to the so-called loading-mode principle and driven in a suitable fashion with the drive signal. A change of a capacitance occurring due to the drive signal between the electrode of the module and a ground potential of the surroundings of the device in which the circuit arrangement and the module are operated is evaluated in this case. The approach of a person to the device causes such a change of the capacitance.

In an enhancement, the module has a second mechanical switch that is coupled to the first and the second evaluation unit of the circuit arrangement, as well as a second electrode. One contact of the second switch is electrically connected to the second electrode.

This embodiment of the module comprises a proximity sensor that is operated in the transmission or absorption mode. Consequently, the module or the sensor comprises two electrodes. The module is operated by means of the drive signal of the circuit arrangement in such a way that an electrical field and a capacitance referred to as transmit-receive capacitance are formed between the first and the second electrode.

In another embodiment, the contact of the second switch forms the second electrode.

In this particularly space-saving embodiment, the second electrode is realized in the form of a contact of the second switch, i.e. the contact of the switch that is situated on the surface of the device.

The first and the second switch preferably are respectively realized in the form of a switch with a pressure point. The switches respectively have a dome-shaped mechanical design and a central pressure point lying underneath the dome-shaped design. Due to their shape, these switches are also referred to as dome switches. Switches of this type are also known as "clickers". A dome-shaped switch surface that in a few of the described embodiments is used as electrode of the capacitive proximity sensor is therefore visible on the outside of the device.

In an alternative embodiment, the second switch is implemented within the second electrode.

The second switch that in this case is also realized in the form of a dome switch is arranged within the surface area of the second electrode in this embodiment.

In an enhancement, the proximity signal is provided according to a change of a value of a transmit/receive capacitance between the first switch and the second switch or between the first electrode and the second electrode of the module.

In the embodiment of the module in the form of a proximity sensor that operates in the transmission or absorption mode, the proximity signal indicates a change of a capacitance that occurs between the first and the second electrode due to the drive signal, i.e. the transmit/receive capacitance.

In another embodiment, the touch signal is provided according to an actuation of the second switch by a person.

In this case, the touch signal also indicates the actuation of the second switch.

In an enhancement, the system has a third mechanical switch that is arranged within the first electrode of the module and connected to the reference potential terminal via a resistor, as well as a fourth mechanical switch that is arranged within the second electrode of the module and connected to the reference potential terminal via an additional resistor. The touch signal is provided according to an actuation of the third and/or fourth switch by a person.

In this embodiment, an additional mechanical switch is respectively realized within the surface area of the first and the second electrode in an advantageous and space-saving fashion. The evaluation of the third and/or fourth switch in the touch signal can be achieved with the aid of the respective resistor. Similar to the first and the second switch, the third and the fourth switch are respectively realized in the form of a switch with a pressure point.

In one embodiment, a method for evaluating a module with a first mechanical switch and an electrode comprises the following steps:
- feeding a drive signal to an electrode of the module in order to drive the electrode as an electrode of a capacitive proximity sensor,
- detecting a change of a capacitance value on the module according to an approach of a person to the module,
- providing a proximity signal according to the change of the capacitance value,
- detecting a change of an amplitude of a current signal on the module according to an actuation of the module by a person, and
- providing a touch signal according to the amplitude change of the current signal.

The invention is described in greater detail below with reference to the figures. In these figures, components and circuit elements with respectively identical function or operation are identified with the same reference symbols. The description of circuit components or elements that correspond with respect to their function is not repeated for each of the following figures.

In these figures:

FIG. 1 shows an embodiment example of a system with a circuit arrangement according to the proposed principle, FIG. 2 shows example signal diagrams of the embodiment according to FIG. 1, FIG. 3 shows a second embodiment example of the system according to the proposed principle, FIG. 4 shows a third embodiment example of the system according to the proposed principle, FIG. 5 shows a fourth embodiment example of the system according to the proposed principle, FIG. 6 shows a fifth embodiment example of the system according to the proposed principle, and FIG. 7 shows an embodiment example of a design for a module according to the proposed principle.

FIG. 1 shows a first embodiment example of a system with a circuit arrangement according to the proposed principle. The circuit arrangement 8 comprises a drive unit A, a first evaluation unit B for key detection, a second evaluation unit C for proximity detection and a terminal 9. The drive unit A, the first evaluation unit B and the second evaluation unit C are respectively connected to the terminal 9. The circuit arrangement 8 additionally comprises an interrupt generator D that is connected to the first and the second evaluation units A, B. The drive unit A is designed for providing a drive signal Sa. The first evaluation unit B is designed to provide a touch signal Sb. The second evaluation unit C is designed to provide a proximity signal Sc.

The system furthermore has a module M that comprises an electrode E1 and a first mechanical switch S1. The module M is connected to the terminal 9 of the circuit arrangement 8. When the module M and the circuit arrangement 8 are connected to one another, they jointly form the system according to the proposed principle. One contact of the first switch S1 forms the electrode E1 in this embodiment. The other contact of the first switch S1 is connected to a reference potential terminal 10.

The drive unit A generates the drive signal Sa with the aid of a first transistor T1 and a second transistor T2 that are connected to one another in series between a supply voltage terminal VBat and the reference potential terminal 10 and controlled by the drive circuit A. The drive signal Sa is generated in such a way that the electrode E1 of the module M is driven as an electrode of a capacitive proximity sensor. A ground capacitance forms between the electrode E1 and an external reference potential 10'. In this embodiment, the module M is therefore operated in the form of a capacitive proximity sensor in the so-called loading mode and at the same time in the form of a mechanical switch S1. The detection of an approach of a person or an actuation of the switch S1 by a person is realized by evaluating a phase signal that is tapped at a resistor Ra coupled to the terminal 9. For this purpose, the first evaluation unit B for key detection evaluates a current signal I at the resistor Ra. The touch signal Sb indicates an actuation of the first switch S1 by a person. The signal Sb is also fed to the interrupt generator D that generates a corresponding interrupt signal S1.

The second evaluation unit C for proximity detection detects a change of the ground capacitance and provides the proximity signal Sc. The proximity signal Sc indicates the approach of a person to the module M and, in particular, to the electrode E1. The proximity signal Sc is likewise forwarded to the interrupt generator D that indicates an approach with a corresponding pulse of the interrupt signal S1.

Due to the advantageous realization of the capacitive proximity sensor in the module M in the form of a contact of the switch S1, in connection with the circuit arrangement 8, it is possible to save space on the surface of an electronic device and to still offer a broad variety of functions.

FIG. 2 shows example signal diagrams of the embodiment according to FIG. 1. The different signals are respectively illustrated in lines underneath one another as a function of the time t. The first line shows the drive signal Sa, the second line shows a phase signal Sk, the third line shows the current signal I, the fourth line shows the proximity signal Sc, the fifth line shows the touch signal Sb and the sixth line shows the interrupt signal SI.

The drive signal Sa comprises trapezoidal pulses that are periodically transmitted by the electrode E1. The second evaluation unit C in FIG. 1 checks the phase of the phase signal Sk at the resistor Ra. If the change of the phase exceeds a certain limit value G that is illustrated with broken lines in this figure, the approach of a person that causes a capacitance change and therefore a phase change has been detected. This is indicated with a pulse of the proximity signal Sc.

As soon as the person presses the first switch S1, the amplitude of the current signal I at the resistor Ra increases rapidly. This increase is detected by the first evaluation unit B and indicated with a pulse of the signal Sb. The interrupt signal SI is low-active. A pulse of the interrupt signal SI is respectively triggered at each occurring pulse of the proximity signal Sc and the touch signal Sb. In this case, the intelligence of the circuit arrangement 8, particularly of the interrupt generator D, ensures that no additional approach is detected immediately after the first switch S1 is released, eventhough during the time in which switch S1 is pressed an approach cannot be detected.

FIG. 3 shows a second embodiment example of the system according to the proposed principle. This embodiment corresponds to the embodiment according to FIG. 1, with the exception that the first switch S1 is realized within the electrode E1 of the module M. As already mentioned above, this means that the switch S1 is mechanically and electrically connected to the electrode E1 that already exists in the electronic device. The electrode E1 is also driven as a capacitive proximity sensor in the so-called loading mode in this example. The detection of an approach is based on a change of the ground capacitance between the electrode E1 and the external reference potential 10' of the surroundings of the electronic device such as, for example, a ground potential.

FIG. 4 shows a third embodiment example of the system according to the proposed principle. In contrast to the embodiments according to FIG. 1 and FIG. 3, the module M realizes a proximity sensor in the transmission or absorption mode. For this purpose, the module M comprises a second switch S2, one contact of which is realized in the form of an electrode E2 of the capacitive proximity sensor. The second electrode E2 and the second switch S2 are respectively coupled to the circuit arrangement 8 via an additional terminal 11. The second evaluation unit C for the proximity detection is coupled to the additional terminal 11. In this case, the phase signal Sk is tapped at the additional terminal 11. The second evaluation unit C essentially comprises an operational amplifier PDA and a analog-digital converter ADC connected downstream thereto. The operational amplifier PDA converts the phase signal Sk from a current signal into a voltage signal that is fed to the analog-digital converter ADC. If the module M is operated in the transmission mode, the amplitude of the phase signal Sk increases during the approach of a person. If the module M is operated in the absorption mode, the amplitude of the phase signal Sk decreases during the approach of a person. The embodiment shown is suitable for both applications. In any case, the proximity signal Sc indicates the approach of a person to the module M.

FIG. 5 shows a fourth embodiment example of the system according to the proposed principle. This embodiment corresponds to the embodiment according to FIG. 4, with the exception that the first and the second electrode E1 and E2 of the module M are realized with a larger surface. The first switch S1 is realized within the area of the first electrode E1. The second switch S2 is realized within the area of the second electrode E2.

Consequently, electrodes E1 and E2 that already exist in the device are combined with the mechanical switches S1 and S2 such that space is advantageously saved.

FIG. 6 shows a fifth embodiment example of the system according to the proposed principle. This embodiment corresponds to the embodiment according to FIG. 5, wherein an additional third switch S3 is provided within the first electrode E1 and an additional fourth switch S4 is provided within the second electrode E2. One contact of the third switch S3 is coupled to the reference potential terminal 10 via a resistor R3. The other contact of the third switch S3 is connected to the electrode E1. One contact of the fourth switch S4 is connected to the reference potential terminal 10 via a resistor R4. The other contact of the fourth switch S4 is connected to the second electrode E2. An additional current signal I' is tapped at the additional terminal 11 and fed to the first evaluation unit B for key detection.

In addition to the detection of an actuation of the first and the second switch S1, S2, the touch signal Sb also indicates an actuation of the third and the fourth switch S3, S4. In this case, the resistors R3 and R4 serve to adjust the amplitude of the respective current signal I or I' that triggers a pulse indicating the detection of a pressed switch S1, S2, S3 or S4 at the respective input of the first evaluation unit B.

In this case, several mechanical switches are advantageously realized within the already existing electrode surfaces in a space-saving fashion.

A person skilled in the art can realize additional mechanical switches within the electrode surfaces with the aid of suitable resistors by applying the preceding description analogously.

FIG. 7 shows an embodiment example of a design for a module according to the proposed principle. As an example, this figure shows the first electrode E1, within which the first and the third switch S1, S3 are realized. According to this figure, the first and the third switch S1, S3 are bonded onto the surface of the electrode E1. This makes it particularly clear how much space is saved.

LIST OF REFERENCE SYMBOLS

8 Circuit arrangement
9, 11 Terminal
10 Reference potential terminal
10' External reference potential
A Drive unit
ADC Analog-digital converter
B, C Evaluation unit
D Interrupt generator
E1, E2 Electrode
G Limit value
I, I' Current signal
M Module
PGA Amplifier
Ra, R3, R4 Resistor S1, S2, S3, S4 Switch
Sa, Sb, Sc, Sk Signal
T1, T2 Transistor
VBat Supply voltage terminal

The invention claimed is:

1. A system, having
a module (M) comprising a first mechanical switch (S1) and an electrode (E1), and
a circuit arrangement (8) having
a terminal (9) that is connected to the module (M),
a drive unit (A) for providing a drive signal (Sa), the drive unit (A) being connected to the terminal (9),
a first evaluation unit (B) for key detection, the first evaluation unit (B) being connected to the terminal (9), and
a second evaluation unit (C) for proximity detection, the second evaluation unit (C) being connected to the first evaluation unit (B),
wherein the drive signal (Sa) is designed for driving the electrode (E1) of the module (M) as an electrode of a capacitive proximity sensor,
wherein the first evaluation unit (B) is designed to provide a touch signal (Sb) as a function of an actuation of the module (M) by a person,
wherein the second evaluation unit (C) is designed to provide a proximity signal (Sc) as a function of the approach of a person to the module (M),
wherein one contact of the first mechanical switch (S1) of the module (M) is electrically connected to the electrode (E1) of the module (M),
wherein the capacitive proximity sensor of the module (M) is realized in the form of the contact of the first mechanical switch (S1), and
wherein the first mechanical switch (S1) and the electrode (E1) of the module (M) are directly connected to one another.

2. The system according to claim 1, with the circuit arrangement (8) furthermore having an interrupt generator (D) that is designed to provide an interrupt signal (S1) as a function of the proximity signal (Sc) and/or the touch signal (Sb).

3. The system according to claims 1 or 2, with the circuit arrangement (8) furthermore having an additional terminal (11) that is designed to be connected to the module (M), wherein the second evaluation unit (C) is also connected to the additional terminal (11).

4. The system according to claims 1 or 2, wherein the first mechanical switch (S1) is implemented within the electrode (E1).

5. The system according to claims 1 or 2,
wherein the proximity signal (Sc) is provided as a function of a change of the value of a ground capacitance between the module (M) and a reference potential terminal (10).

6. The system according to claim 1, wherein the module (M) has a second mechanical switch (S2) that is coupled to the first and the second evaluation unit (B, C) of the circuit arrangement (8), as well as a second electrode (E2), and wherein one contact of the second mechanical switch (S2) is electrically connected to the second electrode (E2).

7. The system according to claim 6, wherein the contact of the second mechanical switch (S2) forms the second electrode (E2).

8. The system according to claim 6, wherein the second mechanical switch (S2) is implemented within the second electrode (E2).

9. The system according to one of claims 6 to 8, wherein the proximity signal (Sc) is provided as a function of a change of a value of a transmit-receive capacitance between the first mechanical switch (S1) and the second mechanical switch (S2) or between the first electrode (E1) and the second electrode (E2) of the module (M).

10. The system according to one of claims 6 to 8, wherein the touch signal (Sb) is provided as a function of an actuation of the second mechanical switch (S2) by a person.

11. The system according to one of claims 6 to 8, furthermore comprising
a third mechanical switch (S3) that is arranged within the first electrode (E1) of the module (M) and connected to a reference potential terminal (10) via a resistor (R3), and
a fourth mechanical switch (S4) that is arranged within the second electrode (E2) of the module (M) and connected to the reference potential terminal (10) via an additional resistor (R4),
wherein the touch signal (Sc) is provided as a function of an activation of the third and/or fourth mechanical switch (S3, S4) by a person.

12. A method for evaluating a module with a first mechanical switch and an electrode, comprising the following steps:
feeding a drive signal (Sa) to an electrode (E1) of the module in order to drive the electrode as an electrode of a capacitive proximity sensor,
detecting a change of a capacitance value (Sk) on the module as a function of an approach of a person to the module (M),
providing a proximity signal (Sc) as a function of the change of the capacitance value (Sk),
detecting a change of an amplitude of a current signal (I) on the module as a function of an actuation of the module (M) by a person, and
providing a touch signal (Sc) as a function of the amplitude change of the current signal (I),
wherein one contact of the first mechanical switch (S1) of the module (M) is electrically connected to the electrode (E1) of the module (M),
wherein the capacitive proximity sensor of the module (M) is realized in the form of the contact of the first mechanical switch (S1), and
wherein the first mechanical switch (S1) and the electrode (E1) of the module (M) are directly connected to one another.

13. The system according to claim 1, wherein the module (M) operates concurrently as the capacitive proximity sensor and as the first mechanical switch (S1).

* * * * *